United States Patent
Shimizu et al.

(10) Patent No.: US 7,504,735 B2
(45) Date of Patent: Mar. 17, 2009

(54) MANUFACTURING METHOD OF RESIN-MOLDING TYPE SEMICONDUCTOR DEVICE, AND WIRING BOARD THEREFOR

(75) Inventors: Yoshiaki Shimizu, Shiga (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/783,715

(22) Filed: Apr. 11, 2007

(65) Prior Publication Data
US 2007/0262462 A1    Nov. 15, 2007

(30) Foreign Application Priority Data
May 11, 2006   (JP) .............................. 2006-132046
Dec. 11, 2006  (JP) .............................. 2006-332714

(51) Int. Cl.
*H01L 23/28* (2006.01)
*H01L 23/053* (2006.01)

(52) U.S. Cl. .................. 257/787; 257/784; 257/701; 257/723

(58) Field of Classification Search .......... 257/773, 257/787, 701, 784, 723, E21.599; 438/113
See application file for complete search history.

(56) References Cited

U.S. PATENT DOCUMENTS

| | | | | |
|---|---|---|---|---|
| 5,976,912 A * | 11/1999 | Fukutomi et al. | ............ | 438/110 |
| 6,064,111 A * | 5/2000 | Sota et al. | .................... | 257/667 |
| 6,077,757 A * | 6/2000 | Mizuno et al. | .............. | 438/465 |
| 6,809,405 B2 * | 10/2004 | Ito et al. | ...................... | 257/666 |
| 6,902,955 B2 * | 6/2005 | Tomihara | .................... | 438/113 |
| 7,061,785 B2 * | 6/2006 | Miwa et al. | ................... | 365/63 |
| 2002/0168796 A1 * | 11/2002 | Shimanuki et al. | .......... | 438/106 |
| 2005/0263864 A1 * | 12/2005 | Islam et al. | ................. | 257/676 |
| 2006/0017142 A1 * | 1/2006 | Jang et al. | ................... | 257/672 |

FOREIGN PATENT DOCUMENTS

JP          2002-246336          8/2002

* cited by examiner

*Primary Examiner*—Nitin Parekh
(74) *Attorney, Agent, or Firm*—Steptoe & Johnson LLP

(57) ABSTRACT

A wiring board for manufacturing a resin-molding type semiconductor device includes a plurality of element regions each having a mount region on which a semiconductor element is mounted and an electrode wire, and a peripheral region surrounding the plurality of element regions and having resin-gripping means such as through holes engaged with a resin with which the plurality of element regions and the peripheral region are sealed.

16 Claims, 11 Drawing Sheets

MANUFACTURING METHOD OF RESIN-MOLDING TYPE SEMICONDUCTOR DEVICE, AND WIRING BOARD THEREFOR

The present application claims priority to Japanese Patent Applications No. 2006-132046, filed May 11, 2006, and No. 2006-332714, filed Dec. 11, 2006, the entire contents of which are hereby incorporated by reference.

BACKGROUND OF THE INVENTION (1) Field of the Invention

The present invention relates to a manufacturing method of a resin-molding type semiconductor device, and a wiring board therefor.

(2) Description of the Related Art

A conventional method for manufacturing a resin-molding type semiconductor device is disclosed, for example, in JP2002-246336A. According to this method, a plurality of semiconductor elements are mounted on a wiring board, and then are collectively sealed with a resin. The wiring board is then divided into one or more semiconductor elements by a dicing process.

FIGS. 14A to 14C are plan views and a sectional view, respectively, illustrating a wiring board serving as a base material for a semiconductor device. The wiring board 1 has the following configuration. A plurality of element regions 6 each have a mount region 2 on which a semiconductor element is mounted. An electrode wire 21 (including wires 3, via holes 4 for internal layer interconnection, and electrode terminals 5) serves as a product circuit. The element regions and electrode wires are arranged in a matrix form to form a product region 7, and a peripheral region 8 surrounds the product region 7. Further, a plurality of seal regions 9, each including such product region 7 and such peripheral region 8 sealed with a resin, collectively, are arranged side by side with slits 10 interposed therebetween.

FIG. 15A to 15D are sectional views and plan views each illustrating a conventional method for manufacturing a resin-molding type semiconductor device. As illustrated in FIG. 15A, first, a semiconductor element 11 is mounted on a mount region 2 of each element region 6 (i.e., a product region 7) in a wiring board 1, and is electrically connected to an electrode wire 21 through a thin, metal wire 12 or the like. Then, a seal region 9 larger in size than the product region 7 is sealed with a resin 13 by collective molding; thus, a resin-molded body 14 is formed. The resin-molded body 14 is divided at slits 10 if necessary.

As illustrated in FIGS. 15B to 15D, next, dicing tape 15 is affixed to a surface of the resin-molded body 14. The resin-molded body 14 is subjected to dicing by means of a dicing blade 16 from a back side of the wiring board 1. The resin-molded body 14 is thus divided into individual semiconductor devices corresponding to the respective element regions 6.

First, the resin-molded body 14 is sequentially cut along cutting lines La, Lb, Lc and Ld in a certain direction, and then it is sequentially cut along cutting lines Le, Lf, Lg and Lh perpendicular to the cutting lines La, Lb, Lc and Ld. In other words, the resin-molded body 14 is first divided into narrow resin-molded body pieces, which are divided into semiconductor devices.

When the resin-molded body pieces are cut, an area outside the product region 7 is also cut (see FIG. 15D). If the dicing blade 16 is rotated at a high speed or is moved rapidly, the resin 13 in the area outside the product region 7 may be peeled off from the dicing tape 15 at the end of the cutting of the spacing, so that the spacing is scattered.

During cutting, the wiring board 1 absorbs any vibration or a stress generated by the rotation of the dicing blade 16 because the wiring board 1 is relatively soft. But the resin 13 is heavily stressed by the vibration. As the cutting of the spacing proceeds, a shearing force becomes small, so that the resin 13 in the spacing cannot endure the stress. Consequently, the resin 13 in the spacing is peeled off from the dicing tape 15. This results in the spacing being scattered. Another reason for such scattering is as follows: bonding between the spacing and the dicing tape 15 is unstable because a portion corresponding to the wiring board 1 is longer than a portion corresponding to the resin 13 in the spacing (see FIG. 15B).

Thus, the resin 13 in the corner of the element region 6 is scattered together with the resin 13 in the spacing immediately before completion of the cutting. Consequently, the resin 13 in a corner of a semiconductor device becomes chipped. In addition, the scattered spacing or the resin in such spacing collides with the dicing blade 16, and the dicing blade 16 may be damaged. In FIG. 15D, a shaded portion is readily scattered.

To overcome these problems, conventionally, the resin 13 in the spacing is prevented from being peeled off from the dicing tape 15 by slowly rotating or moving the dicing blade 16. Thus, the resin 13 in the corner of the semiconductor device is prevented from becoming chipped and the dicing blade 16 is prevented from being damaged. However, this results in poor productivity.

SUMMARY OF THE INVENTION

The present invention is devised in view of the aforementioned problems. An object of the present invention is to prevent a resin in a spacing from being peeled off from a dicing tape while dicing, thereby preventing the resin in a semiconductor device from becoming chipped, preventing a dicing blade from being damaged, and improving productivity.

To accomplish this object, a wiring board according to a first embodiment of this invention comprises a plurality of element regions, each having a mount region and at least one electrode wire; a semiconductor element mounted on said mount region; a peripheral region surrounding the plurality of element regions; a plurality of resin-gripping means located in said peripheral region; and resin, for sealing said element regions and said peripheral regions and contacting said resin-gripping means, such that when the element regions are separated by cutting, the resin is secured to the wiring board by the resin-gripping means.

In another embodiment, each resin-gripping means is either a concave part or a convex part.

In another embodiment, the plurality of element regions may be arranged in a matrix form, such that the element regions are arranged in rows that are perpendicular to one another.

In another embodiment, the resin-gripping means are located at opposite ends of each row of the element regions.

In another embodiment the resin-gripping means are located adjacent each outside edge of the matrix.

In another embodiment the resin-gripping means are arranged in multiple rows parallel to a respective adjacent outside edge of said matrix.

In another embodiment the resin-gripping means are arranged in staggered rows, the rows parallel to a respective adjacent outside edge of said matrix.

In another embodiment the resin-gripping means are further located in an area of the wiring board outside the peripheral region.

In another embodiment the convex part is a resist.

In another embodiment the convex part comprises a metal pattern coated with a resist.

In another embodiment the metal pattern is the same metal as the electrode wire.

According to the present invention, a manufacturing method of a resin-molding type semiconductor device includes the steps of: preparing a wiring board including a plurality of element regions each having a mount region and an electrode wire, and a peripheral region surrounding the plurality of element regions and having resin-gripping means engaged with a resin; mounting a semiconductor element on each of the plurality of element regions in the wiring board; sealing the plurality of element regions each having the semiconductor element mounted thereon and the peripheral region with the resin; and dividing a resin-molded body sealed with the resin and having the resin-gripping means engaged with the resin into semiconductor devices corresponding to the respective element regions by dicing.

Upon performance of sealing with a resin, preferably, the resin in the peripheral region is made smaller in thickness than the resin in the element region. Thus, it is possible to lessen a stress to be applied to the resin when dicing.

BRIEF DESCRIPTION OF THE INVENTION

FIGS. 1A to 1D respectively illustrate a configuration of a wiring board according to a first embodiment of the present invention;

FIGS. 2A to 2E respectively illustrate a method for manufacturing a resin-molding type semiconductor device using the wiring board illustrated in FIGS. 1A to 1D;

FIGS. 3A and 3B respectively illustrate a shape of a resin in the resin-molding type semiconductor device manufactured using the wiring board illustrated in FIGS. 1A to 1D;

Figure 7A:
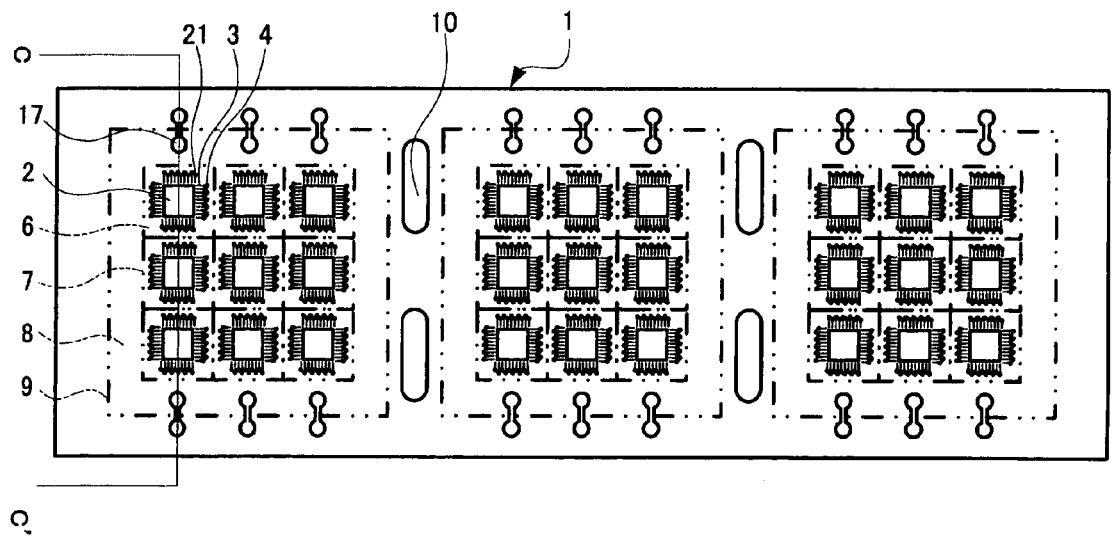
Figure 7B:
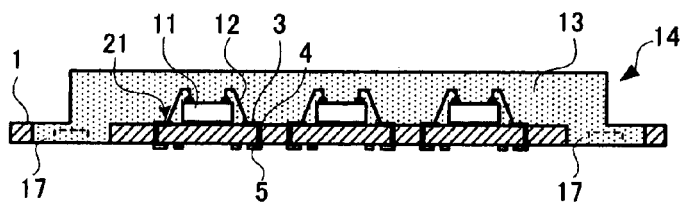
Figure 8:
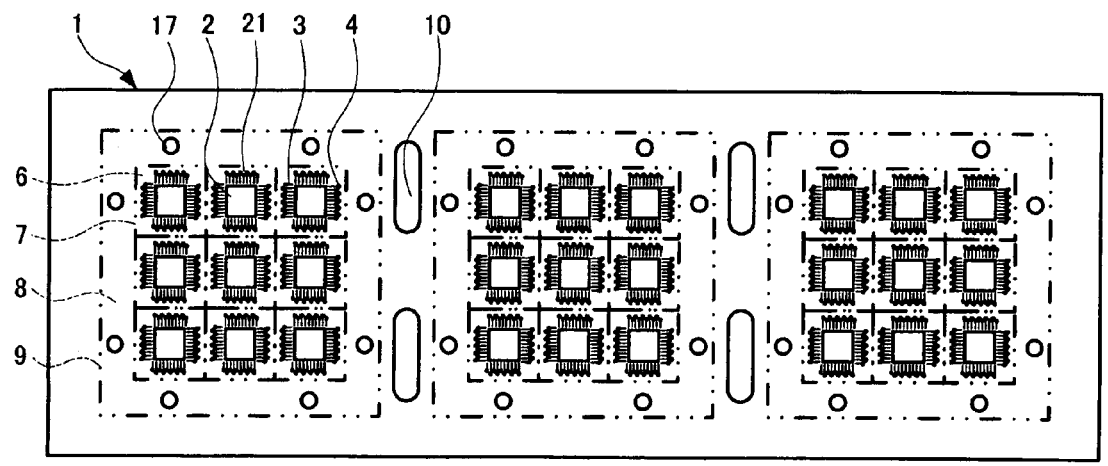
Figure 9:
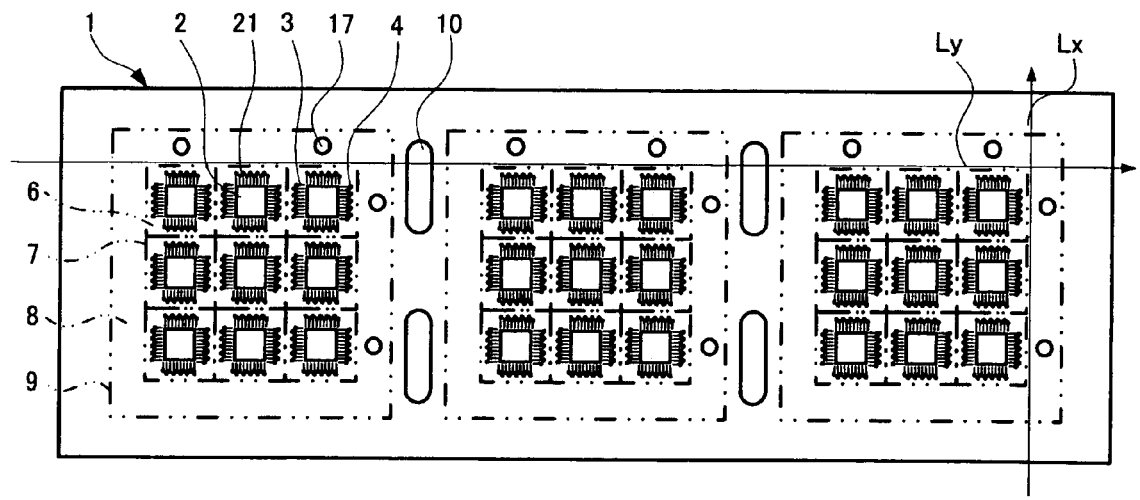
Figure 10:
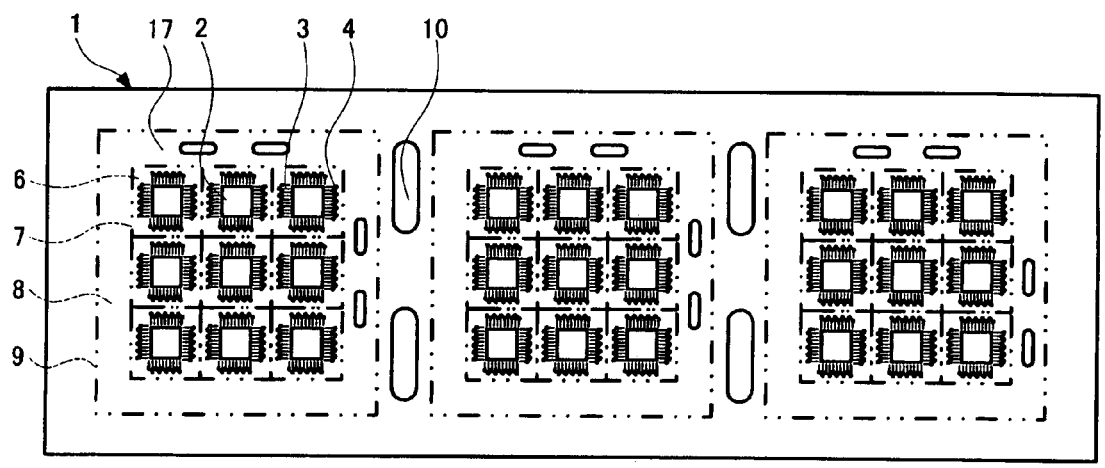
Figure 11A:
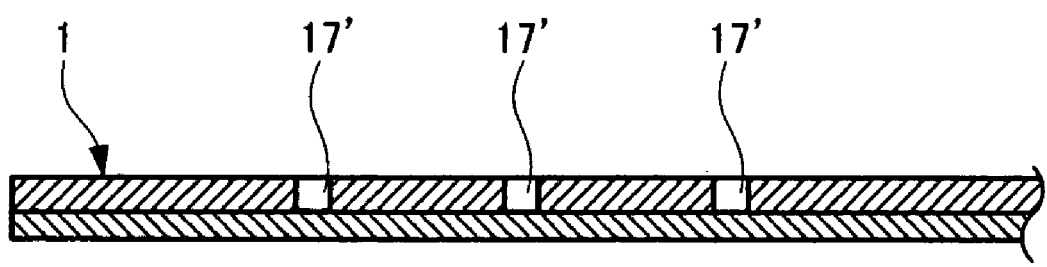
Figure 11B:
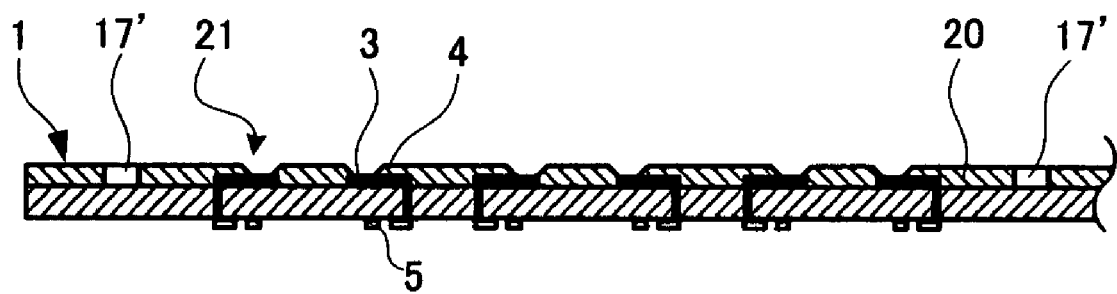
Figure 12A:
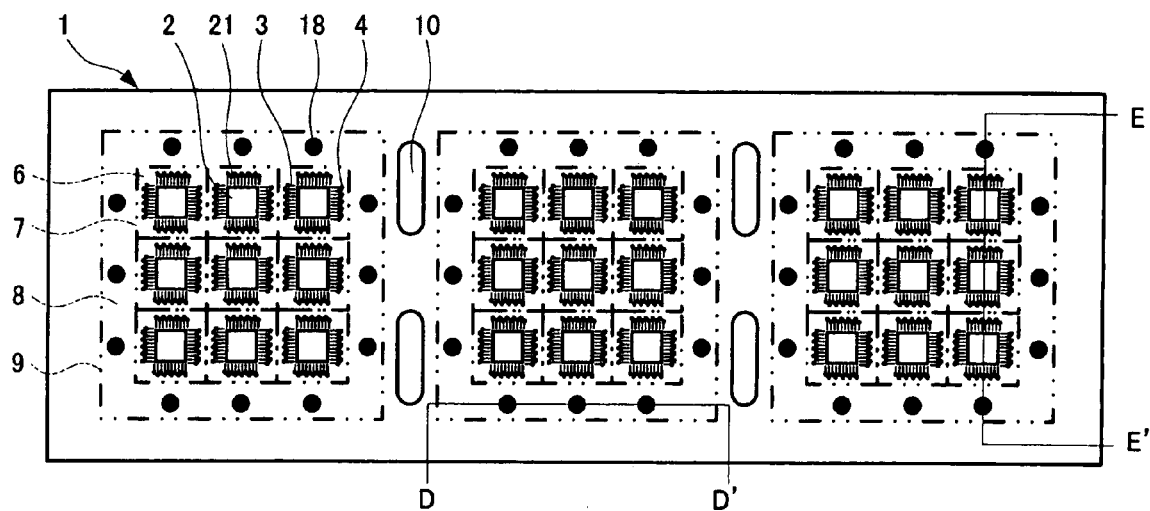
Figure 12B:
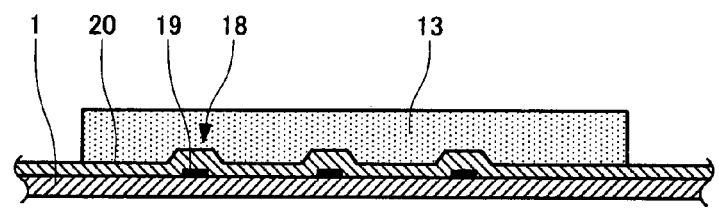
Figure 12C:
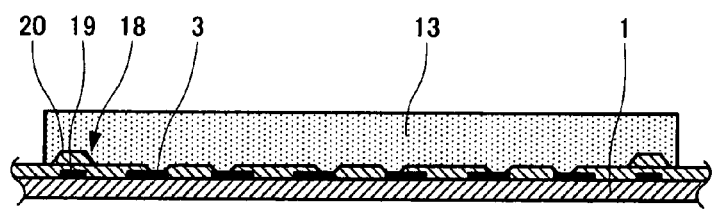
Figure 13A:
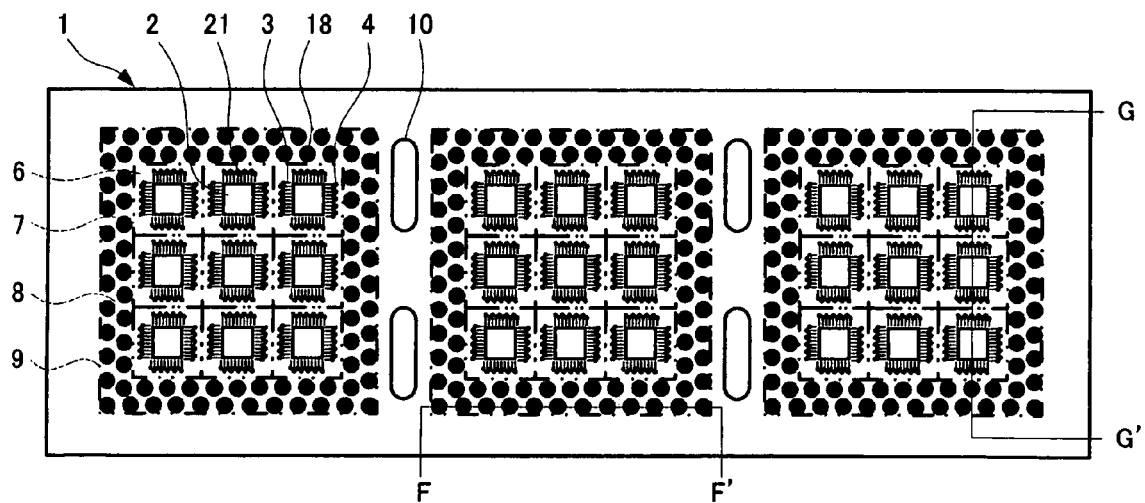
Figure 13B:
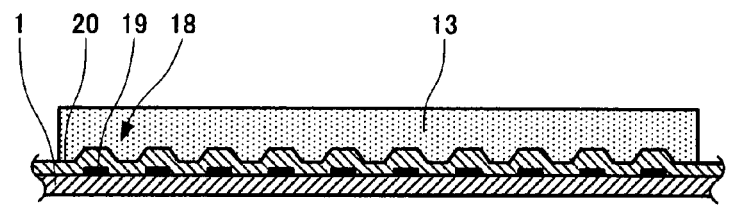
Figure 13C:
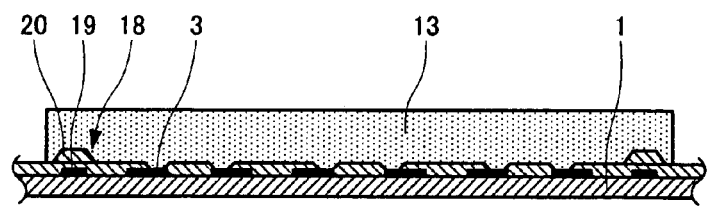
Figure 14A:
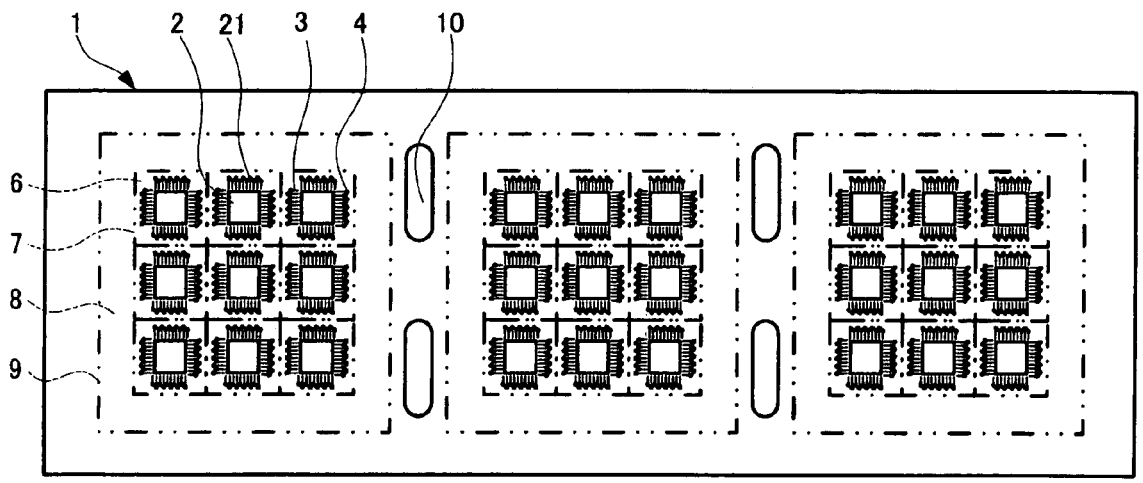
Figure 14B:
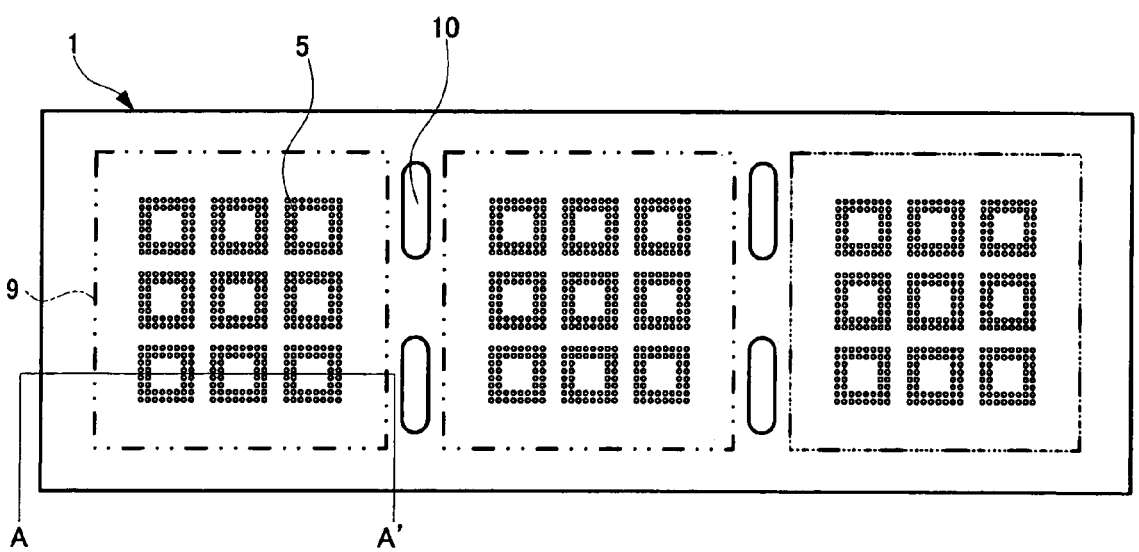
Figure 14C:
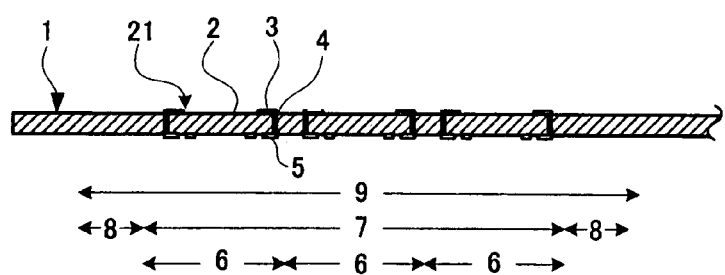
Figure 15A:
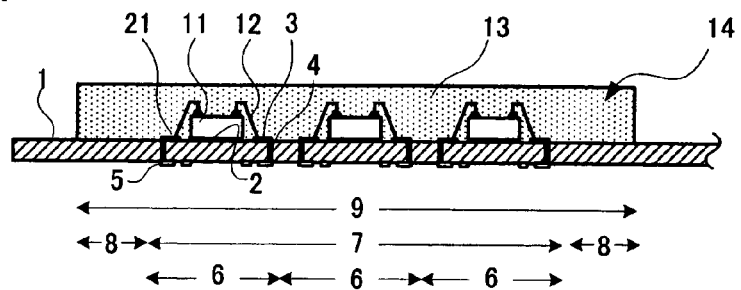
Figure 15B:
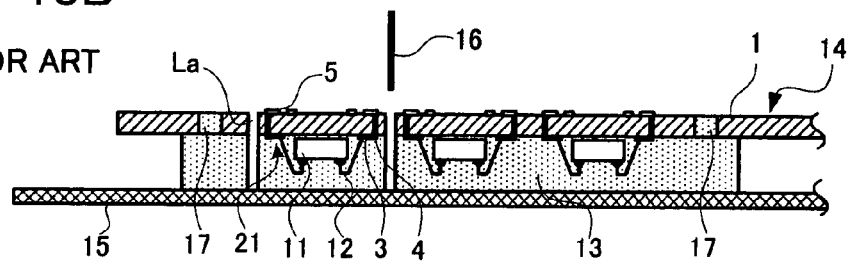
Figure 15C:
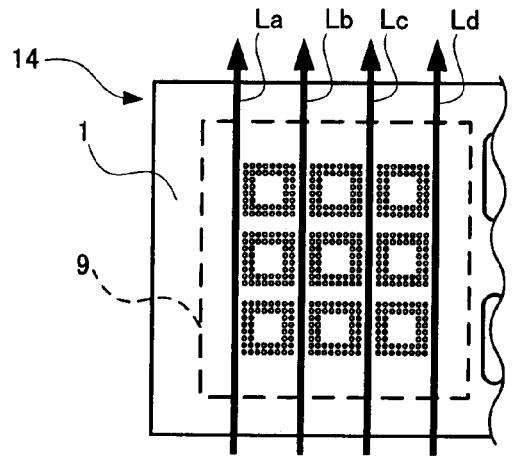
Figure 15D:
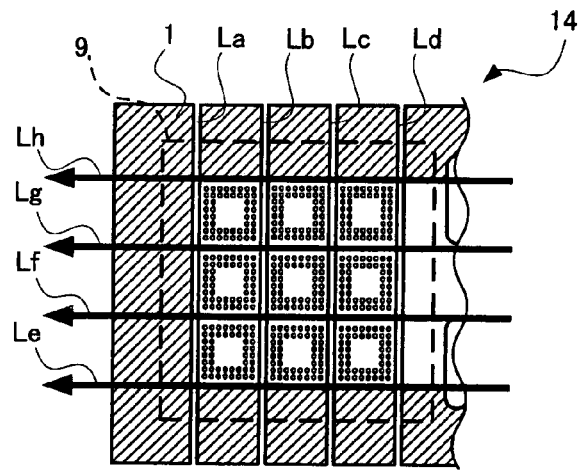

FIGS. 7A and 7B respectively illustrate a configuration of a wiring board according to a fifth embodiment of the present invention;

FIG. 8 illustrates a configuration of a wiring board according to a sixth embodiment of the present invention;

FIG. 9 illustrates a configuration of a wiring board according to a seventh embodiment of the present invention;

FIG. 10 illustrates a configuration of a wiring board according to an eighth embodiment of the present invention;

FIGS. 11A and 11B respectively illustrate a configuration of a wiring board according to a ninth embodiment of the present invention;

FIGS. 12A to 12C respectively illustrate a configuration of a wiring board according to a tenth embodiment of the present invention;

FIGS. 13A to 13C respectively illustrate a configuration of a wiring board according to an eleventh embodiment of the present invention;

FIGS. 14A to 14C respectively illustrate a conventional wiring board; and

FIGS. 15A to 15D respectively illustrate a conventional method for manufacturing a resin-molding type semiconductor device using the wiring board illustrated in FIGS. 14A to 14C.

DESCRIPTION OF THE PREFERRED EMBODIMENTS

Hereinafter, description will be given of preferred embodiments of the present invention with reference to the drawings.

Figure 1A:
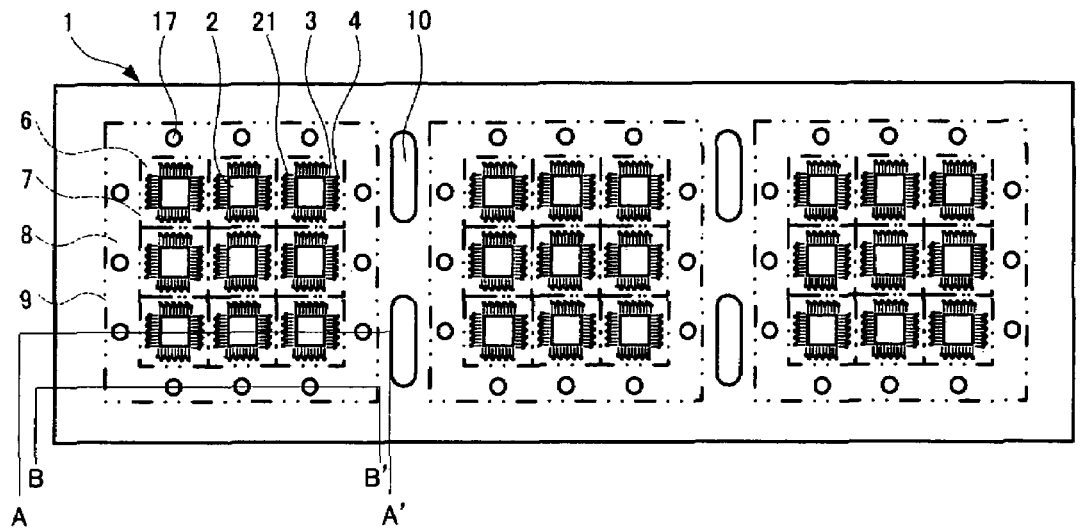
Figure 1B:
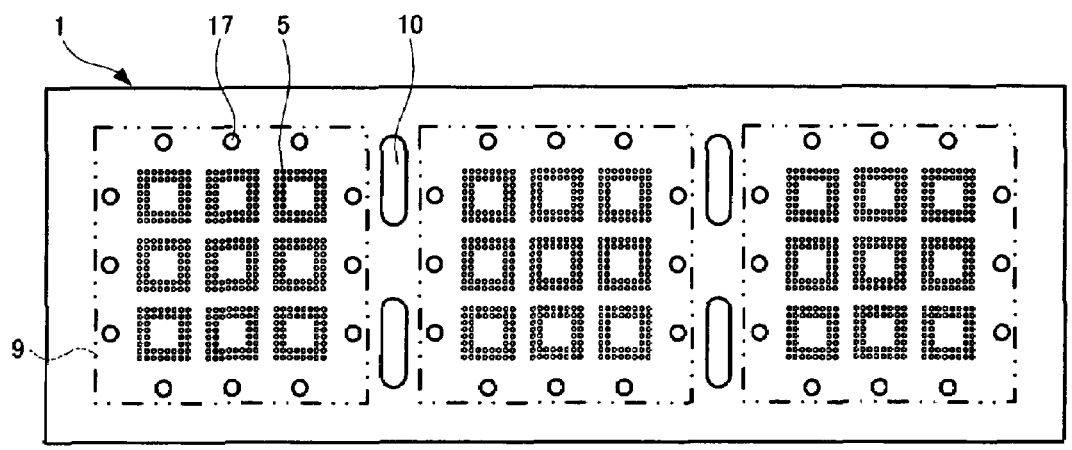
Figure 1C:
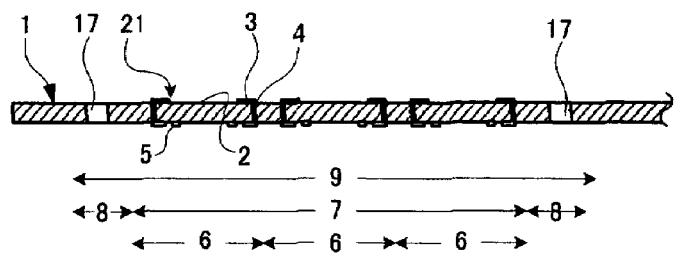
Figure 1D:
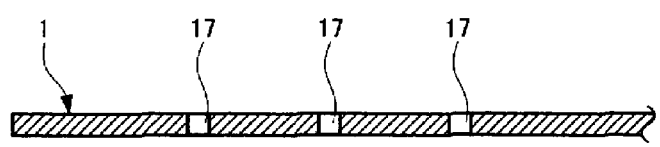

FIGS. 1A to 1D respectively illustrate a configuration of a wiring board according to a first embodiment of the present invention. More specifically, FIG. 1A is a plan view illustrating an element mount face (a front face) of the wiring board, FIG. 1B is a plan view illustrating an electrode terminal face (a back face) of the wiring board, FIG. 1C is a sectional view taken along a line A-A' in FIG. 1A, and FIG. 1D is a sectional view taken along a line B-B' in FIG. 1A.

As illustrated in FIGS. 1A to 1D, the wiring board 1 has the following configuration. A plurality of element regions 6 each having a mount region 2 on which a semiconductor element is mounted and an electrode wire 21 serving as a product circuit are arranged in a matrix form to form a product region 7. A peripheral region 8 surrounds the product region 7. Further, a plurality of seal regions 9 each including such product region 7 and such peripheral region 8 sealed with a resin, are arranged side by side with slits 10 interposed therebetween.

The electrode wire 21 includes wires 3 provided on or around a mount region 2 so as to be electrically connected to a semiconductor element. Via holes 4 for internal layer interconnection from which the wires 3 are led out toward the back face of the wiring board 1, and electrode terminals 5 are formed on the back face of the wiring board 1. The electrode wire 21 is made of Cu or the like, and the wiring board 1 is made of a glass epoxy material as a base material.

The wiring board 1 according to this embodiment is different from a conventional wiring board (see FIGS. 14A to 14C) in that through holes 17 are formed on a peripheral region 8 surrounding a product region 7, or a region that serves as spacing when dicing.

Through holes 17 each formed into a circular shape, are uniformly spaced around the outside edges of a product region 7. Specifically, through holes 17 are provided at both ends of each row of element regions 6. More specifically, through holes 17 are provided at right and left ends of each row of element regions 6, and are arranged as a row parallel to the outer edge of the product region. Further, through holes 17 are provided at top and bottom ends of each row of element regions 6 arranged in a row parallel to the other edge of the product region. Each through hole 17 is formed on a region corresponding to an end side of an element region 6 (i.e., a width of a row of element regions 6), is located at a center of the end side, and has a dimension smaller than that of the endside. Such through holes 17 can be formed together with slits 10. Therefore, no additional steps are necessary to form the through holes 17.

Figure 2A:
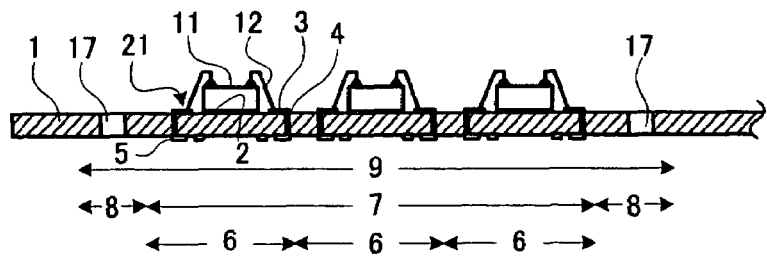

FIGS. 2A to 2E respectively illustrate a method for manufacturing a resin-molding type semiconductor device. As illustrated in FIG. 2A, first, a semiconductor element 11 is die bonded to a mount region 2 of each element region 6 (i.e., a product region 7) in the wiring board 1 through an adhesive such as an Ag paste. Then, electrodes on a circuit face of the semiconductor element 11 are electrically connected to electrode pads of wires 3 through thin, metal thin wires 12 made of Al or Au. Alternatively, bumps (e.g., solder bumps or Au bumps) are previously formed on the electrodes on the circuit face of the semiconductor element 11, and are connected to the electrode pads of the wires 3 with the circuit face of the semiconductor element 11 directed downward (so-called flip-chip connection).

Figure 2B:
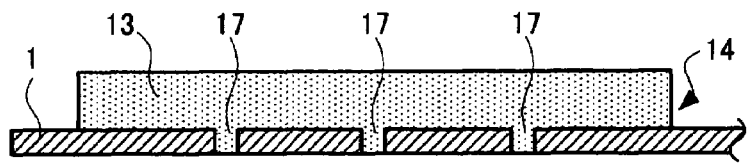
Figure 2C:
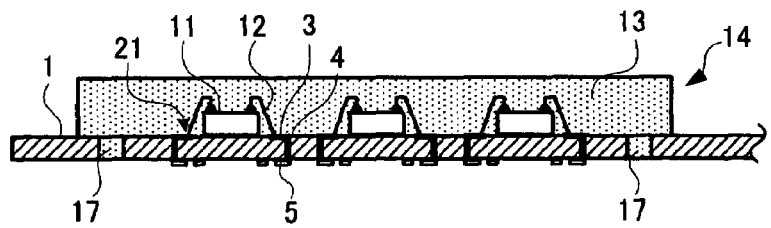

As illustrated in FIGS. 2B and 2C, next, a seal region 9, which is larger than the product region 7, is sealed with a resin 13 such as an epoxy resin by collective molding. Thus, a resin-molded body 14 is formed. To form such resin-molded body 14, the wiring board 1 is inserted into a heated mold such that the seal region 9 is placed in a cavity of the mold, and then the resin 13, which is melted, is fed into the cavity and is cured.

Thus, the resin 13 is filled into through holes 17. Expansion/contraction of the wiring board 1, which occurs by such sealing, is absorbed by the slits 10. In addition, such expansion/contraction does not occur locally because the through holes 17 are uniformly spaced around the product region 7. Thus, the sealing of the semiconductor elements is improved because connection failures due to variations in temperature upon sealing are reduced. After formation of the resin-molded body 14, the wiring board 1 may be divided at the slits 10.

Figure 2D:
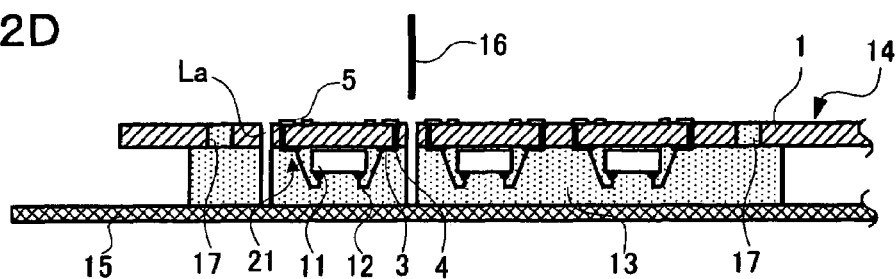

As illustrated in FIG. 2D, next, a dicing tape 15 is affixed to a resin face of the resin-molded body 14. Then, the resin-molded body 14 is diced by means of a dicing blade 16 from a back face side of the wiring board 1; thus, the resin-molded body 14 is divided for each semiconductor device corresponding to the element region 6.

Figure 2E:
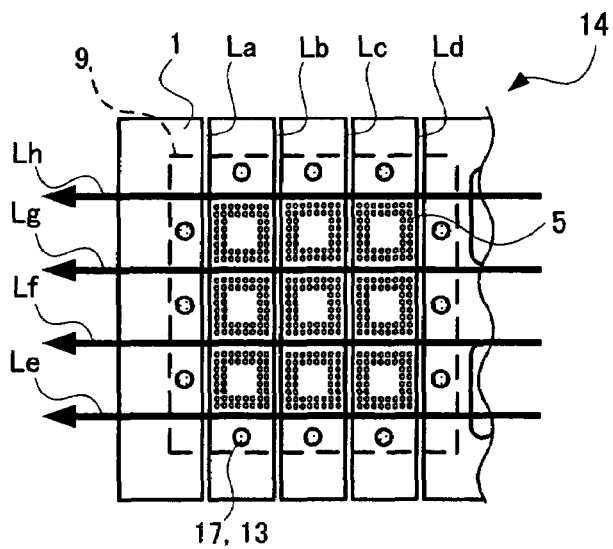

As illustrated in FIG. 2E, the resin-molded body 14 is then sequentially cut along cutting lines La, Lb, Lc and Ld in a vertical direction (an X direction), and then is sequentially cut along cutting lines Le, Lf, Lg and Lh in a lateral direction (a Y direction). In other words, the resin-molded body 14 is divided into narrow resin-molded body pieces, and then the resin-molded body pieces are divided into semiconductor devices.

Upon division of the resin-molded body pieces, the resin 13 that is filled into the through holes 17 is bonded to the wiring board 1 because of an increase in close-contact area and an anchor effect. In addition, the through holes 17 are provided at both ends of each row of the element regions 6. Therefore, even when the sealed-resin body pieces are cut along any of the aforementioned cutting lines, the resin 13 in a spacing to be cut is fixedly bonded to the wiring board 1. Moreover, each through hole 17 is formed on a region corresponding to an end side of the element region 6. Therefore, even when the resin 13 filled into the through hole 17 is cut by the dicing blade 16, a stress generated by such cut is not increased.

And even when the dicing blade 16 is rotated at a high speed or is moved rapidly, the stress generated from the dicing blade 16 is effectively absorbed by the wiring board 1. As a result, it is possible to prevent the resin 13 in the spacing from being peeled off from the dicing tape 15 and to prevent the cut spacing from being scattered. Hence, it is possible to prevent the resin in a corner of a semiconductor device from becoming chipped or cracked due to scattering of a spacing and to prevent the dicing blade 16 from being damaged. In addition, it is possible to improve productivity since it is unnecessary add fabrication steps, as described above.

Figure 3A:
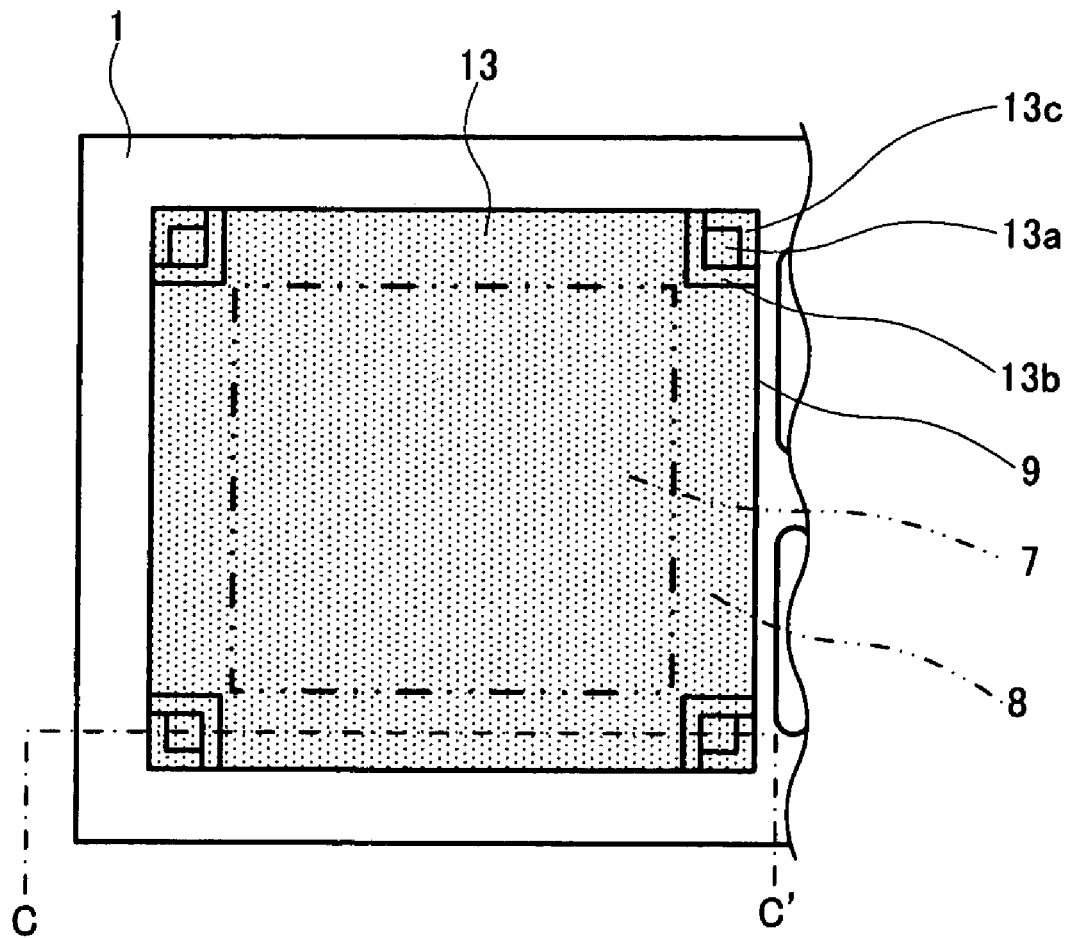
Figure 3B:
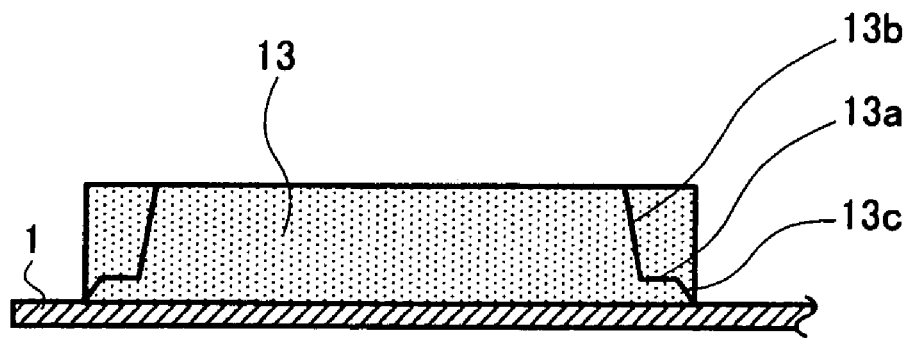

As illustrated in FIGS. 3A and 3B, it is also possible to reduce the stress generated from the dicing blade 16 and applied to the resin 13 when the resin 13 in the peripheral region 8 is thinner than the resin 13 in the product region 7. Herein, the resin 13 in the corner of the peripheral region 8 includes a thinner portion 13a, an inclined portion 13b formed between the resin 13 in the product region 7 and the thinner portion 13a, and an inclined portion 13c formed at a periphery of the lower portion 13a. Thus, the thickness of each of the inclined portions 13b and 13c is gradually reduced.

Figure 4:
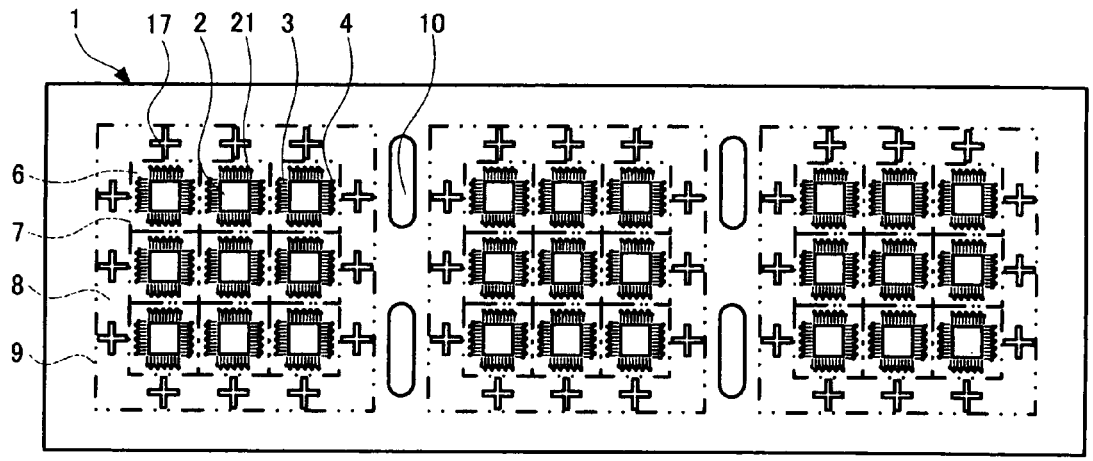
FIG. 4 illustrates a configuration of a wiring board according to a second embodiment of the present invention.
Figure 5:
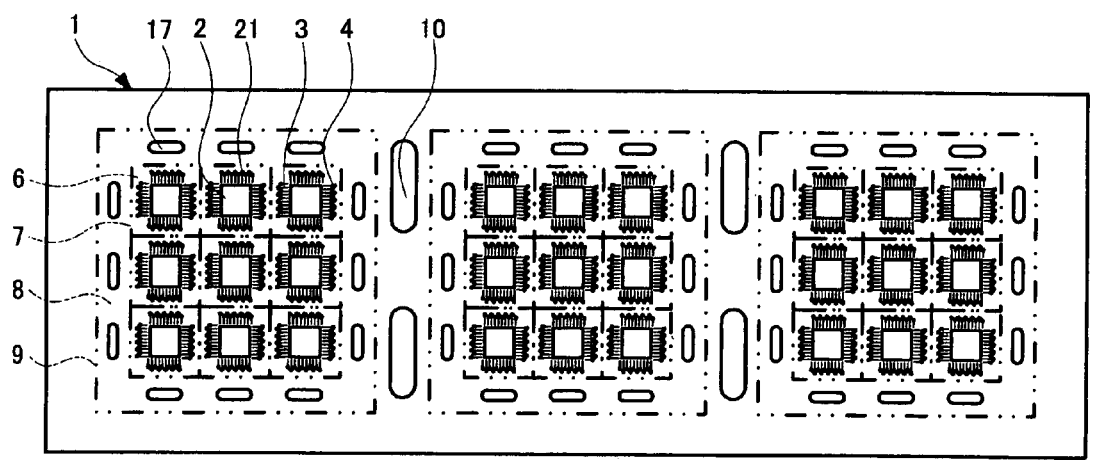
FIG. 5 illustrates a configuration of a wiring board according to a third embodiment of the present invention.
Figure 6:
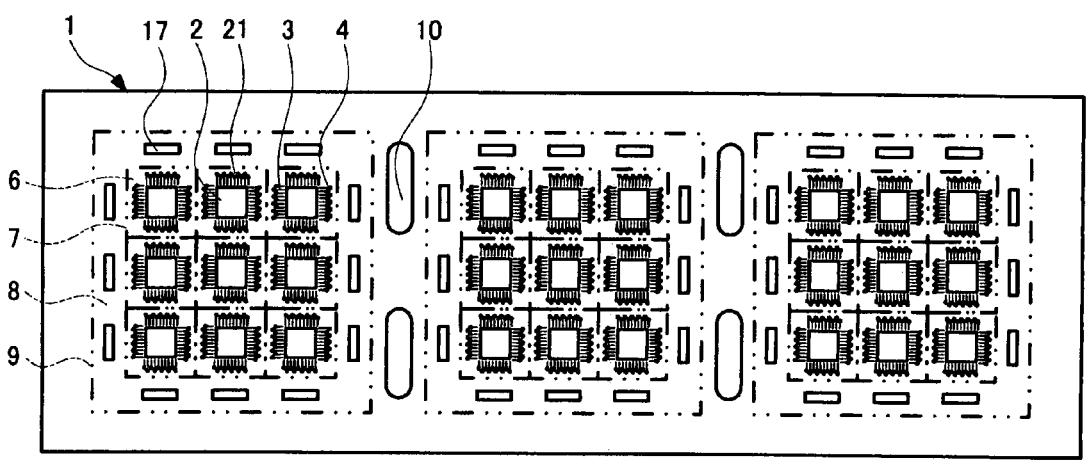
FIG. 6 illustrates a configuration of a wiring board according to a fourth embodiment of the present invention.

In the present invention, the through hole 17 is for fixedly bonding the resin 13 to the wiring board 1 and for preventing the spacing or the resin in the spacing from being scattered; therefore, the position and shape thereof are not particularly limited. For example, a through hole 17 may be formed into a shape of a cross as illustrated in FIG. 4. Alternatively, a through hole 17 may be formed into an oval shape as illustrated in FIG. 5. Still alternatively, a through hole 17 may be formed into a polygonal shape such as a rectangular shape as illustrated in FIG. 6. Preferably, such through hole 17 is formed into a shape of a cross because it can be engaged with a resin 13 at many sites. However, the shape may be appropriately changed according to design restrictions.

Alternatively, a through hole 17 may be formed in a peripheral region 8, as well as a non-seal region located outside the peripheral region 8, as illustrated in FIGS. 7A and 7B. Specifically, through holes 17 are provided at top and bottom ends of each row of element region 6. The through holes 17 are not located on the left and right sides of the peripheral region, so as not to overlap with slits 10. Each through hole 17 includes a pair of circular holes formed at a boundary between the peripheral region 8 and the non-seal region and a slit connecting the pair of circular holes. Moreover, through holes 17 are small so that each through hole 17 is spaced as far away from the product region 7 as possible. When the through hole 17 is formed in the peripheral region 8 and the non-seal region, an anchor effect of fixedly bonding a resin 13 to a wiring board 1 can be enhanced.

In FIG. 8, through holes 17 are provided at both ends of each outermost row of element regions 6 arranged in a matrix form.

In FIG. 9, through holes 17 are provided at one end of each outermost row of element regions 6 arranged in a matrix form. More specifically, in a case when a wiring board 1 is divided for each element region 6 by dicing in a vertical direction (an X direction) and dicing in a lateral direction (a Y direction) in sequence, the through holes 17 are provided at a peripheral region 8 located along a first cutting line (Ly) in the Y direction, and the through holes 17 are provided downstream of the cutting line (Ly) in the Y direction at the peripheral region 8 located along a cutting line (Lx) in the X direction.

In a spacing, a portion (a corner) having a small contact area with a dicing tape 15 is easily scattered. Therefore, providing through holes only at adjoining portions as illustrated in FIGS. 8 and 9 is also effective.

In FIG. 10, each through hole 17 is provided at a region corresponding to end sides of adjoining two of element regions 6 arranged in a matrix form. With this configuration, it is possible to reduce through holes 17 in number and to fixedly bond a resin in a spacing to be cut to a wiring board 1. Reducing the number of through holes 17 is effective, although such through holes 17 can be formed concurrently with slits 10.

In a case where a wiring board 1 is a double-sided wiring board, that is, a wiring board 1 is of a single-layer structure and wires or electrode terminals are formed on both sides thereof, it is convenient that a through hole 17 is provided as described above. On the other hand, as illustrated in FIG. 11A, in a case where a wiring board 1 is a multilayer wiring board, that is, a wiring board 1 is of a multilayer structure (having a wiring layer and an insulating layer formed therein) and wires or electrode terminals are formed on both sides thereof, a through hole may be a counter-bored hole 17' opened only at a surface layer on an element mount face or may be a through hole formed by laser processing so as to penetrate through entire layers. Alternatively, as illustrated in FIG. 11B, when a resist 20 is provided on an element mount face, a through hole to be provided may be a counter-bored hole 17' opened only at the resist 20.

FIGS. 12A to 12C respectively illustrate a configuration of another wiring board according to the present invention. More specifically, FIG. 12A is a plan view illustrating an element mount face (a front face) of the wiring board, FIG. 12B is a sectional view taken along a line D-D' in FIG. 12A after sealing the board with a resin, and FIG. 12C is a sectional view taken along a line E-E' in FIG. 12A after sealing the board with a resin.

The wiring board 1 has circular convex parts 18 at the same positions and of the same dimensions as the aforementioned through holes 17 illustrated in FIGS. 1A to 1D. Each convex part 18 is formed by coating a metal pattern 19 with a resist 20. The convex part 18 can be formed by using part of a metal layer required for forming a wire 3, and a resist. Therefore, it is unnecessary to increase the number of fabrication steps of the wiring board 1.

The height of the convex part 18, as illustrated in FIG. 12C, is formed by coating the metal pattern 19 (having a thickness of about several micrometers if it is formed from a metal layer equal to a metal layer configuring a wire 3) with the resist 20 multiple times. The resist 20 in one coating has a thickness in a range of several micrometers to several tens of micrometers. The product region 7 has a normal resist thickness while covered with a mask.

As with the aforementioned through hole 17, the convex part 18 may be formed into an oval shape (see FIG. 5), a rectangular shape (see FIG. 6) or a shape of a cross (see FIG. 4).

As with the aforementioned through hole 17 (see FIG. 7), the convex parts 18 may be formed over a peripheral region 8 and a non-seal region located outside the peripheral region 8. Thus, an anchor effect of the convex part 18 is exerted throughout a resin 13. Therefore, the resin 13 in a spacing is completely prevented from being scattered. As described above, the convex part 18 has the configuration that the metal pattern 19 is coated with the resist 20. Since the resist 20 has elasticity, even when the convex part 18 is crimped by sealing molds, there is no gap formed between the sealing molds. As a result, it is possible to prevent resin leakage. In many cases, the resist 20 is made of a photosensitive polymeric material cured by irradiation with light. Examples of such material include polyvinyl-based cinnamate, epoxy resin-based cinnamate, polyvinyl benzalacetophenone, and the like.

The through hole 17 or the convex part 18 formed over the peripheral region 8 and the non-seal region is particularly convenient when the wiring board 1 is effectively used by standardizing its size and the sealing mold used, even when various types of semiconductor devices are manufactured (accordingly, even when required element regions 6 (product regions 7) differ for each semiconductor device). A seal region 9 has a fixed size in correspondence with the sealing mold, so when the element region changes in size, the peripheral region 8 becomes narrower. However, even when the through hole 17 or the convex part 18 formed over the peripheral region 8 and the non-seal region has one end placed near the non-seal region in the peripheral region 8, an anchor effect is exerted throughout a resin. Thus, a single mask for forming the convex part 18 can be used irrespective of the width of the peripheral region 8.

FIGS. 13A to 13C respectively illustrate a configuration of still another wiring board according to the present invention. More specifically, FIG. 13A is a plan view illustrating an element mount face (a front face) of the wiring board, FIG. 13B is a sectional view taken along a line F-F' in FIG. 13A after sealing the board with a resin, and FIG. 13C is a sectional view taken along a line G-G' in FIG. 13A after sealing the board with a resin.

The wiring board 1 is different from the wiring board 1 illustrated in FIGS. 12A to 12C in that a plurality of convex parts 18 are provided in a staggered form along end sides of element regions 6 so as to surround a product region 7. This arrangement of the convex parts 18 makes it possible to increase an area coming into contact with a resin 13, thereby enhancing an anchor effect. As a result, it is possible to effectively prevent the resin 13 from being peeled off from a dicing tape 15. When a plurality of convex parts 18 are provided as described above, it is unnecessary to make each convex part 18 very high. Therefore, such convex part 18 may be formed by using only a resist 20.

In addition to the aforementioned provision in a staggered form, the plurality of convex parts 18 may be provided linearly along the end sides of the element regions 6. Alternatively, the plurality of convex parts 18 may be provided in plural rows (in a lattice form). Still alternatively, the plurality of convex parts 18 may be provided at random. Any of the aforementioned provisions makes it possible to increase a close-contact area and to enhance an anchor effect.

As described above, the wiring board 1 according to the present invention has the configuration that the through hole 17 or the convex part 18 engaged with the resin 13 is provided in or on the peripheral region 8 surrounding the matrix of element regions. Therefore, it is possible to fixedly bond the resin 13 to the wiring board 1 to enhance an anchor effect. Thus, the wiring board 1 effectively absorbs a stress generated by dicing, so that the resin 13 can be prevented from being peeled off from the dicing tape 15.

Accordingly, even when the dicing blade 16 is rotated at a high speed or is moved rapidly, it is possible to prevent the resin 13 in the spacing from being peeled off from the dicing tape 15 and to prevent the spacing from being cut or the resin in such spacing from being scattered. Further, it is possible to prevent the resin in a product from becoming chipped and to prevent the dicing blade 16 from being damaged. Moreover, since it is unnecessary to add a fabrication step, productivity improves.

The aforementioned shapes and provisions of the through hole 17 or the convex part 18 may be applied in combination. Further, the through hole 17 and the convex part 18 maybe applied to a base material used like the wiring board 1. Such base material is, for example, a lead frame in which die pad parts and lead parts are provided in plural sets.

What is claimed is:

1. A wiring board comprising:
a plurality of element regions, each having a mount region and at least one electrode wire, said element regions for being separated from one another by cutting;
a semiconductor element mounted on said mount region;
a peripheral region surrounding the plurality of element regions and including neither an electrode wire nor an electrical lead;
resin, for sealing said element regions, said semiconductor element, and said peripheral region; and
a plurality of through holes located in the peripheral region for engaging said resin.

2. The wiring board according to claim 1, wherein the plurality of element regions are arranged in a matrix form, such that the element regions are arranged in rows that are perpendicular to one another.

3. The wiring board according to claim 2, wherein the through holes are located at opposite ends of each row of the element regions.

4. The wiring board according to claim 2, wherein the through holes are located adjacent each outside edge of said matrix.

5. The wiring board according to claim 2, wherein the through holes are arranged in multiple rows parallel to a respective adjacent outside edge of said matrix.

6. The wiring board according to claim 2, wherein the through holes are arranged in parallel, staggered rows, parallel to a respective adjacent outside edge of said matrix.

7. The wiring board according to claim 2, wherein the through holes are further located in an area of the wiring board outside the peripheral region.

8. A wiring board comprising:
a plurality of element regions, each having a mount region and at least one electrode wire, said element regions for being separated from one another by cutting;
a semiconductor element mounted on said mount region;
a peripheral region surrounding the plurality of element regions and including neither an electrode wire nor an electrical lead;
resin, for sealing said element regions, said semiconductor element, and said peripheral region; and
a plurality of resin-gripping means comprising either a concave part or a convex part, said resin-gripping means located on the peripheral region of the wiring board and coated with said resin.

9. The wiring board according to claim 8, wherein the convex part is a resist.

10. The wiring board according to claim 8, wherein the convex part comprises a metal pattern coated with a resist.

11. The wiring board according to claim 10, wherein the metal pattern is the same metal as the electrode wire.

12. The wiring board according to claim 8, wherein the plurality of element regions are arranged in a matrix form, such that the element regions are arranged in rows that are perpendicular to one another.

13. The wiring board according to claim 12, wherein the concave parts or the convex parts are located at opposite ends of each row of the element regions.

14. The wiring board according to claim 12, wherein the concave parts or the convex parts are located adjacent each outside edge of said matrix.

15. The wiring board according to claim 12, wherein the concave parts or the convex parts are arranged in multiple rows parallel to a respective adjacent outside edge of said matrix.

16. The wiring board according to claim 12, wherein the concave parts or the convex parts are arranged in parallel, staggered rows, parallel to a respective adjacent outside edge of said matrix.

* * * * *